United States Patent [19]

Hartman

[11] Patent Number: 4,577,051

[45] Date of Patent: Mar. 18, 1986

[54] BYPASS DIODE ASSEMBLY FOR PHOTOVOLTAIC MODULES

[75] Inventor: Robert A. Hartman, Chagrin Falls, Ohio

[73] Assignee: The Standard Oil Company, Cleveland, Ohio

[21] Appl. No.: 655,900

[22] Filed: Sep. 28, 1984

[51] Int. Cl.4 ............................................. H01L 25/02
[52] U.S. Cl. ...................................................... 136/244
[58] Field of Search ......................................... 136/244

[56] References Cited

U.S. PATENT DOCUMENTS 4,481,378 11/1984 Lesk ...................................... 136/244

FOREIGN PATENT DOCUMENTS 1522618 8/1978 United Kingdom ................. 136/244

OTHER PUBLICATIONS

*Solar Cell Array Design Handbook,* Chapter 5, Jet Propulsion Laboratory, California Institute of Technology, Pasadena, Calif., Oct. 1976.

*Primary Examiner*—Aaron Weisstuch
*Attorney, Agent, or Firm*—Larry W. Evans; Thomas P. Schur; Jeffrey A. Wyand

[57] ABSTRACT

A bypass diode assembly (10) for a photovoltaic module (11) incorporating a plurality of electrically conductive strips (12), each having a long leg (13) and a short leg (14). The long leg (13) of each conductive strip (12) is in overlapped relation with the long leg (13) of another conductive strip (12). A diode (21) is interposed between successive conductive strips (12) in the vicinity of the overlapped relation and is electrically associated therewith. A bridging portion comprising diagonal arm (20) is carried by each long leg (13) and is oriented to dissipate stress experienced by the conductive strip (12). The short leg (14) is suitably located and configured for electrically communicating with the substrate layer (15) of a corresponding photovoltaic cell strip (16).

14 Claims, 3 Drawing Figures

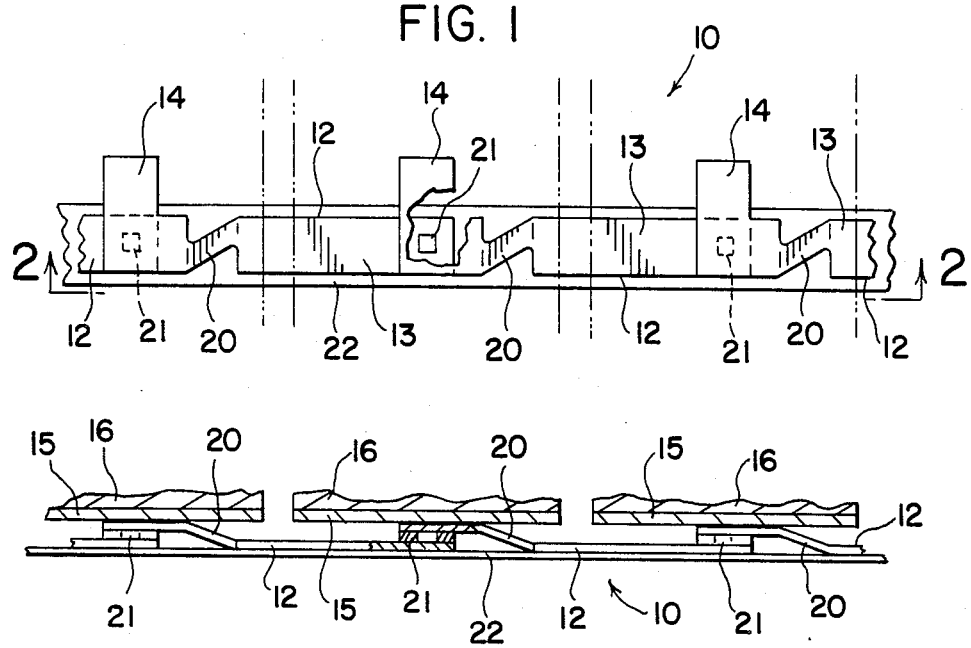

BYPASS DIODE ASSEMBLY FOR PHOTOVOLTAIC MODULES

TECHNICAL FIELD

The present invention relates generally to a photovoltaic cell module encompassing a plurality of individual photovoltaic cell strips. More particularly, the present invention relates to a bypass diode circuitry for a photovoltaic module. To elaborate on this aspect, the present invention relates to a bypass diode circuitry wherein a plurality of individual diodes are carried by electrically conductive strips such that each diode is electrically communicated in series with another diode, and each diode is capable of being electrically interconnected with one photovoltaic cell strip of a photovoltaic module.

BACKGROUND ART

With the increasing cost of conventional energy sources, such as coal, oil and natural gas, attention has been directed to harnessing solar energy. Substantial gains have been made in the development of photovoltaic technology, but the cost per unit of usable energy continues to be excessive. Contributing factors of such high cost are found in the cost of production of photovoltaic devices—primarily, cost of material and man-hours for assembly—maintenance costs and reliability of extended performance.

Advances in the development of the photovoltaic cell itself have been forthcoming. Indeed, the production of amorphous solar cells, such as amorphous silicon cells, has considerably reduced material cost of photovoltaic assemblies. For a more detailed discussion regarding the development of amorphous solar cells, reference may be made to U.S. Pat. No. 4,409,605, to Ovshinsky et al.

Even with the reduction in material costs, the overall cost of photovoltaic devices remains high. This is primarily due to the man-hours involved in assembly of photovoltaic modules and arrays as well as maintenance and lack of proven extended reliability.

A photovoltaic module generally includes a plurality of photovoltaic cells, or similar power generating members, that are electrically interconnected in series and/or in parallel to produce the desired output voltage and current. When all the photovoltaic cells of the module are operating properly, the electrical output of the module properly represents the aggregation of the output of the individual cells. When, however, one or more of the cells experiences a reduction in output, either temporarily or permanently, the output of the module may be dramatically affected. For example, should one cell develop an open circuit, or otherwise become current limiting, power from other cells in series therewith will be restricted by the open circuit. Likewise, should one cell fail to generate power, for example it may be shadowed from the activating light, that cell may become reverse biased and thereby restrict the power output of all the cells electrically interconnected in series with it. Moreover, should the cell be only temporarily shadowed, such as by a leaf or other debris temporarily covering the cell, the electrical potential across the cell, as a result of reverse biasing, may cause the cell to be permanently damaged.

To obviate these problems, bypass or shunt diodes are employed in the module. These bypass diodes, generally, are connected across rows of parallel-connected photovoltaic cells, in parallel therewith. When all the cells are fully illuminated and producing energy, the bypass diodes are reverse biased and the current flow is through the cells. However, when current flow through any photovoltaic cell becomes limited, and thereby reverse biased, the parallel-connected bypass diode becomes forward biased, and current flow thus is conducted through the bypass diode and around the affected cell, thereby conditionally bypassing the affected cell and protecting the same from damage.

Ideally, a bypass diode should be associated with each photovoltaic cell or power generating member. However, such is not economically practical, as it is necessary to interconnect each diode with the corresponding cell and further to provide adequate heat dissipation for each diode while maintaining a relatively compact configuration of the photovoltaic module, in toto.

As such, it has generally been accepted in practice to employ one bypass diode for a plurality of interconnected cells, i.e., sub-modules. While this reduces production cost for the module, it detrimentally affects the performance thereof. Indeed, should one cell of the submodule experience a reduction of power output, the entire sub-module, with the remaining productive cells, may be conditionally electrically isolated, as a result of the bypass diode, from the power network of the module. Therefore, the output power of the module, as a whole, may be substantially reduced disproportionately as a result of the power loss of a single cell. And, as such, the module itself would be in need of substantial remedial repairs to restore the module to full performance.

In addition to the foregoing, the electrical interconnections between bypass diode and cell and between successive bypass diodes must be carefully considered. Indeed, these interconnections are subjected to a multitude of stresses resulting from mechanical loading and thermal cycling. As such, these electrical interconnections may experience fatigue failure during the life of the photovoltaic module, thereby necessitating remedial repairs.

Despite the substantial developments made regarding photovoltaic devices, no photovoltaic module or array provides an inexpensive and reliable assembly for conditionally electrically bypassing a power generating segment—either an individual photovoltaic cell or a plurality of cells—of the module. Namely, no module or array incorporates individual bypass diodes electrically associated with each photovoltaic cell in a manner that is both economical from a production aspect and reliable from an extended use aspect.

DISCLOSURE OF THE INVENTION

In general, a bypass diode assembly for a photovoltaic module according to the concept of the present invention includes a plurality of electrically conductive strips. Each conductive strip is in a non-contacting overlapped relation with another conductive strip. A diode is interposed between one conductive strip and another conductive strip in the vicinity of the overlapped relation and electrically associated therewith. Means are provided to electrically communicate a conductive strip with a power generating member of the module.

A preferred embodiment of a bypass diode assembly for a photovoltaic module incorporating the concept of the present invention is shown by way of example in the accompanying drawings without attempting to show all the various forms and modifications in which the invention might be embodied, the invention being measured by the appended claims and not by the details of the specification.

BRIEF DESCRIPTION OF THE DRAWINGS

FIG. 1 is a plan view of an exemplary segment of a bypass diode assembly embodying the concept of the present invention;

FIG. 2 is a fragmentary cross section taken substantially along line 2—2 of FIG. 1; and, FIG. 3 is a plan view of a photovoltaic module incorporating a bypass diode assembly embodying the concept of the present invention.

PREFERRED EMBODIMENT FOR CARRYING OUT THE INVENTION

Figure 3:
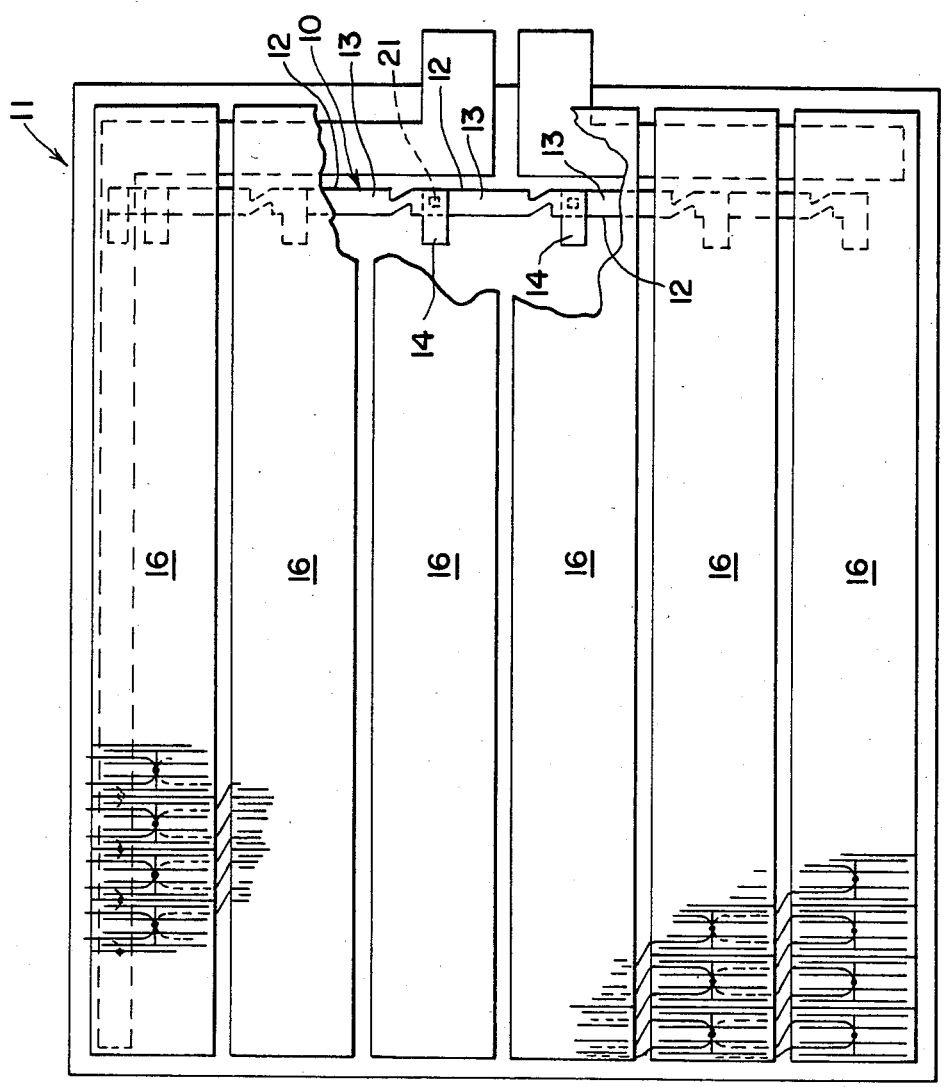

A bypass diode assembly, hereafter referred to as a diode tape for convenience, according to the present invention is indicated generally by the numeral 10 in Fig. 1. The diode tape 10 depicted therein and described hereinbelow is particularly suitable for incorporation into a photovoltaic module as set forth in a U.S. Patent Application filed contemporaneously herewith, viz., U.S. patent application Ser. No. 656,175, filed Sept. 24, 1984, for "Photovoltaic Cell Module", and incorporated herein by reference. FIG. 3 depicts an exemplary installation of diode tape 10 in such a photovoltaic module 11. The diode tape 10, itself, includes a plurality of overlapped conductor strips 12, which may be formed of very thin copper or similar electrically conductive material. It should be noted that while conductor strips 12 are in overlapped relation, they are not physically in contact with each other. The conductor strips 12 are preferably L-shaped with the long leg 13 positioned longitudinally along the length of the diode tape 10 and the short leg 14 positioned laterally thereto. The short leg 14 thus provides an area to be electrically connected to the substrate layer 15 of a power generating element, or an equivalent segment of a module 11 such as a photovoltaic cell strip 16. Such connection can be effected in any acceptable manner such as spot welding, soldering, or applying an electrically conductive epoxy. Therefore, it should be appreciated that the conductor strips 12 should be so arranged such that the short legs 14 are suitably spaced apart to align with the substrate layer 15 of the correspondingly spaced cell strips 16.

Long leg 13 of each conductive strip 12 incorporates a bridging portion forming a stress relief region, as defined by a diagonal arm 20, to permit the controlled dissipation of stress induced as a result of thermal expansion. Particularly, as the module 11, as a whole, is heated and cooled during the diurnal cycle, the individual cell strips 16 move relative to each other, thereby inducing tension or compression stresses in the diode tape 10. Diagonal arm 20 represents a segment of the long leg 13, and has a cross sectional area approximately one-third of the long leg 13. Furthermore, diagonal arm 20 is oriented approximately 45° from the longitudinal axis of the diode tape 10. It should thus be appreciated that as successive cell strips 16, with the corresponding short leg 14 secured thereto, move relative to each other, diagonal arm 20 will permit such movement with minimal amount of stress imposed thereon.

Interposed between the overlap of successive conductor strips 12 are wafer or chip diodes 21, thereby defining substantially unidirectional current flow paths between the corresponding conductor strips 12 which otherwise are not in physical contact with each other. It should be appreciated that such diodes 21 enable the diode tape 10 to retain a relatively thin configuration as depicted in FIG. 2. This allows the diode tape 10 to be secured to the cell strips 16 without detrimentally affecting the substantially planar surface of the overall module 11 as defined by the substrate layers 15 of the individual cell strips 16. Furthermore, such a relatively thin configuration assures effective encapsulation of the module 11 with a protective covering, should such be desired.

Inasmuch as the diode tape 10 is of relatively thin material, and thus inherently delicate, it is preferable to employ a non-conductive reinforcing tape 22 to provide reinforcement thereto. Such reinforcing tape 22 is preferably an adhesive backed polymer tape. While reinforcing tape 22 primarily provides mechanical support to the diode tape 10 itself, it may also be used to provide temporary securement of the diode tape 10 to the cell strips 16 during the process of electrically interconnecting the short legs 14 to the corresponding substrate layer 15.

The mechanical advantages of the disclosed embodiment are found in the remarkable flexibility thereof. Particularly the thin conductive material, from which conductor strips 12 are made, offers very little resistance to movement of successive cell strips 16 relative to each other. This is extremely desirable when amorphous silicon solar cells are employed as it enhances the overall flexibility of module 11, such amorphous silicon solar cell modules having a high degree of flexibility relative to crystalline solar cell modules as discussed in U.S. Ser. No. 656,175, referenced hereinabove.

This advantageous flexibility of diode tape 10 is further enhanced by diagonal arm 20 which permits lateral movement to occur between successive cell strips 16. As such, thermal expansion and contraction of module 11, as well as between individual cell strips 16, does not cause detrimental stresses to be experienced by diode tape 10 or at the electrical junctures at which it is connected to the individual cell strips 16.

The use of diode tape 10 further enhances the efficiencies of module 11 as it permits a bypass diode 21 to be electrically connected in parallel with each cell strip 16, as opposed to the normal practice of employing one bypass diode for two or more cells. This furthermore obviates the excessive man-hours required for electrically connecting the individual diodes in normal practice. Moreover, it eliminates situations where blocks of cells are removed from the current generating circuit when only one fails to generate the required output. The use of diode tape 10 electrically bypasses, from the overall circuit, only that cell strip 16 which fails to generate the required output. Therefore, the overall output of module 11 will diminish only slightly and the module 11 will remain within acceptable performance limits.

In conjunction with this, diode tape 10 represents a substantial advantage in the production aspect of photovoltaic modules. Instead of requiring the painstaking practice of individually locating and securing individual bypass diodes to each photovoltaic cell strip, thereby resulting in excessive man-hours, diode tape 10 is prefabricated to electrically associate bypass diodes 21 together. In production, one needs only to position a length of diode tape 10 relative to substrate layer 15 of the applicable cell strips 16 and secure the same thereto in any suitable manner, such as for example spot welding, soldering or applying a conductive epoxy. Indeed, such operation may be automated to further reduce the man-hours involved in fabricating module 11. Moreover, by incorporating diode tape 10 with substrate layer 15 of cell strips 16, and encapsulating the same therewith, heat generated by diodes 21 will be dissipated efficiently without the need of costly heat sinks. Such heat dissipation will promote longevity of diodes 21 themselves.

The advantages of the disclosed diode tape 10 may be better appreciated by considering an exemplary module incorporating the teachings herein. In particular, reference is made to a photovoltaic module 11 incorporating amorphous silicon solar cells and having a total power output of 57 watts with a nominal voltage of 12 volts, direct current (D.C.). Such a module is more specifically discussed in the above-referenced U.S. Patent Application.

The individual cell strips 16 are approximately 5 centimeters (1.97 inches) wide by 120 centimeters (47.24 inches) long. The output of each cell strip 11 is approximately 1.2 volts, D.C., and 3.96 amperes of current when exposed to sunlight under AM-1 conditions.

A total of twelve cell strips 16 were electrically interconnected in series and diode tape 10 was connected in parallel therewith. As would be appreciated by one knowledgeable in electrical circuits, such a series interconnection permits an aggregation of the voltage output from each cell strip 16 while maintaining a constant amperage. As such, the electrical output of the module 11 is approximately 14.4 volts, D.C., and 3.96 amperes; and, thus a power output of approximately 57 watts is attainable.

The operation of the foregoing diode tape 10 is exemplary of the instant disclosure. When all the cell strips 16 are exposed to an activating light source, current flows evenly therethrough, with energy from the transparent top layer of one cell strip 16 being conducted to the substrate layer 15 of the next adjacent cell strip 16 through the aforesaid series interconnection.

When, however, one cell strip 16 is shadowed from the activating light source, the output of that cell strip 11 is substantially reduced and it becomes reversed biased, thereby preventing current flow therethrough. Under these conditions, electrical energy received by the substrate layer 15 of the disabled cell strip 16, from the aforesaid series interconnection, is conducted through diode tape 10 to the substrate layer 15 of the next adjacent cell strip 16 to continue the electrical circuit. Particularly, current is received from the substrate layer 15 of the disabled cell strip 16 through the electrical junction formed with the short leg 14 of the corresponding conductive strip 12. The current flows through long leg 13 of the conductive strip 12 to the bypass diode 21 carried thereby. Bypass diode 21 becomes forward biased, thereby permitting current flow therethrough to the short leg 14 of the next adjacent conductive strip 12 and, in turn, to the substrate layer 15 of the next adjacent photovoltaic cell strip 16. Thereafter the current flows through successive cell strips 16 in the normal operating fashion.

It should be appreciated that the foregoing situation resulted in the electrical isolation of only one cell strip 11 through the bypassing procedure. As such, the total reduction in output from the exemplary module 11 as a result of power reduction of one cell strip 16 was a drop of approximately 1.8 volts, i.e., slightly in excess of the output of a single cell strip 16. Moreover, when the cell strip 16 was re-exposed to the activated light source, it resumed full power generation with no apparent permanent damage.

While the foregoing exemplary module permits an individual photovoltaic cell strip to be conditionally electrically bypassed, it should be appreciated that more than one cell strip may be so bypassed. Indeed, from a production aspect, it could be deemed more economical to associate one diode for a plurality of cell strips. As such, a discrete power generating segment of the module will be subject to being conditionally electrically bypassed in the event of cell failure. It should nevertheless be appreciated that in such an association, the disclosed invention defines a more economical assembly, from a production aspect, for incorporation into a photovoltaic module.

Thus, in view of the foregoing disclosure, it should be appreciated that a bypass diode assembly embodying the concept of the invention disclosed herein provides flexibility to the photovoltaic module in which it is incorporated. Furthermore, the disclosed invention substantially improves the extended use reliability of the module as it causes only the defective or disabled photovoltaic cells to be electrically bypassed in the circuit. In addition, manufacture and production of photovoltaic modules is substantially simplified, and more economical, as a result of the disclosed invention. As such, the foregoing should be recognized as constituting a new, novel and advantageous contribution to the art.

I claim:

1. An apparatus for conditionally electrically bypassing a power generating segment of a photovoltaic assembly including a plurality of electrically interconnected power generating elements, said apparatus comprising:
   a plurality of diodes each having two opposed terminals; and
   a plurality of electrically conducting strips, each said strip including a generally planar longitudinal leg having first and second ends and a bridging arm portion joining said first and second ends, said first end of one said strip at least partially overlapping said second end of a next adjacent said strip, one of said diodes being disposed between each of said overlapping ends with each of its said terminals in electrical communication with a respective one of said overlapping ends.

2. An apparatus according to claim 1 including stress relief means within each said strip for relieving mechanical stress.

3. An apparatus according to claim 2 wherein said stress relief means comprises said bridging arm portion formed as an angular arm disposed generally diagonally to said longitudinal leg.

4. An apparatus according to claim 3, wherein said diagonal arm has a cross sectional area of approximately one-third the cross sectional area of said longitudinal leg.

5. An apparatus according to claim 1 including means for establishing electrical communication between said apparatus and the power generating segments of a photovoltaic assembly.

6. An apparatus according to claim 5 wherein said means for establishing electrical communication includes a lateral leg projecting from each of said strips.

7. A photovoltaic power generating apparatus comprising a plurality of electrically interconnected power generating elements arranged side by side each having an electrically conducting substrate, a plurality of diodes each having two opposed terminals, and, a plurality of electrically conducting strips, each said strip including a generally planar longitudinal leg having first and second ends and a bridging arm portion joining said first and second ends, said first end of one said strip at least partially overlapping said second end of a next adjacent said strip, one of said diodes being disposed between each of said overlapping ends with each of its terminals in electrical communication with a respective one of said overlapping ends, each of said first ends of said strips being in electrical communication with a substrate of a different one of said power generating elements.

8. An apparatus according to claim 7 including stress relief means within each said conductive strip for relieving mechanical stress.

9. An apparatus according to claim 8 wherein said stress relief means comprises said bridging arm portion formed as an angular arm disposed generally diagonally to said longitudinal leg.

10. An apparatus according to claim 9 wherein said diagonal arm has a cross sectional area of approximately one-third the cross sectional area of said longitudinal leg.

11. The apparatus according to claim 7 wherein said first end of each said strip includes a projecting lateral leg in electrical communication with one of said substrates.

12. An apparatus for conditionally electrically bypassing a power generating segment of a photovoltaic assembly including at least two electrically interconnected power generating elements, said apparatus comprising:

at least one diode having two opposed terminals; and at least one pair of first and second electrically conducting strips, each said strip including a generally planar longitudinal leg having first and second ends and a bridging arm portion joining said first and second ends, said first end of said second strip of said pair at least partially overlapping said second end of said first strip of said pair, said diode being disposed between said overlapping ends with each of its said terminals in electrical communication with a respective one of said overlapping ends of said pair.

13. An apparatus according to claim 12 including means for establishing electrical communication between said apparatus and the power generating segments of a photovoltaic assembly.

14. An apparatus according to claim 13 wherein said means for establishing electrical communication includes a lateral leg projecting from each of said strips.

* * * * *